(12) United States Patent
Patrovsky

(10) Patent No.: US 7,955,569 B2
(45) Date of Patent: Jun. 7, 2011

(54) METAL HALIDE REACTOR FOR CVD AND METHOD

(76) Inventor: Hubert Patrovsky, St. Eustache (CA)

(*) Notice: Subject to any disclaimer, the term of this patent is extended or adjusted under 35 U.S.C. 154(b) by 516 days.

(21) Appl. No.: 11/717,244

(22) Filed: Mar. 14, 2007

(65) Prior Publication Data
US 2008/0226821 A1    Sep. 18, 2008

(51) Int. Cl.
*B01J 8/02* (2006.01)
*C01B 9/00* (2006.01)

(52) U.S. Cl. ......... 422/211; 422/202; 423/491; 427/253

(58) Field of Classification Search .......... 422/198, 422/199, 202, 211, 220, 239; 423/491–495; 427/252, 253
See application file for complete search history.

(56) References Cited

U.S. PATENT DOCUMENTS

| | | | |
|---|---|---|---|
| 3,365,316 A * | 1/1968 | Kingery et al. | 117/99 |
| 4,112,148 A * | 9/1978 | Fonzi | 427/255.32 |
| 4,348,980 A * | 9/1982 | Thevenot et al. | 118/717 |
| 4,890,574 A * | 1/1990 | Sarin et al. | 118/719 |
| 6,136,725 A | 10/2000 | Loan | |
| 6,265,311 B1 | 7/2001 | Hautala | |
| 6,296,711 B1 | 10/2001 | Loan | |
| 6,440,494 B1 | 8/2002 | Arena-Foster | |
| 6,451,692 B1 | 9/2002 | Derderian | |
| 6,663,716 B2 | 12/2003 | Loan | |
| 6,787,185 B2 | 9/2004 | Derderian et al. | |
| 6,861,105 B2 | 3/2005 | Veerasamy | |
| 7,101,509 B2 | 9/2006 | Chang | |

FOREIGN PATENT DOCUMENTS

JP    55104471 A  *  8/1980

* cited by examiner

*Primary Examiner* — Jennifer A Leung

(57) ABSTRACT

A reaction vessel (reactor) is shown that, filled with metal and placed either within a CVD type furnace or in a housing in fluid communication with the CVD type furnace can produce commercial quantities of a metal halide gas over extended time periods and multiple furnace runs. The control of temperature and the simplicity of this reaction vessel allows temperature differentials between the metal halide gas produced and the CVD type reactor target thus providing differing deposits. The reactor is noteworthy in that no valves, flow restrictors or other equipment which could create corrosion problems is used in the heated/reactive area of the vessel thus producing very high quality metal halide gas.

11 Claims, 5 Drawing Sheets

FIGURE 1 -- EQUILIBRIUM FOR Ti + 2Cl₂

METAL HALIDE REACTOR FOR CVD AND METHOD

SUMMARY OF INVENTION

There is a need for a layer of relatively pure chrome or other metals that, while not as thick as electroplated deposits, is much thicker than the deposits used in electronic devices. These deposits would be useful for medical, frictional and corrosion proofing applications. The present deposition methods are electroplating, usually a producer of environmentally noxious residues, sputtering, a line of sight method that applies metal atoms to the surface of a target part, and various chemical vapor deposition (CVD) processes where a compound is dissociated and the metal atoms are deposited upon the part surface. The chemical vapor deposition methods can be nearly residue free but obtaining relatively pure chrome is very difficult due to the highly corrosive nature of the best (halide) precursors, the high temperatures required, the self contaminating (carbon or oxygen containing) precursors, or due to gas interactions (nitrogen). While precursor gases are obtainable in small quantities for lab scale reactors, there is a need for a precursor generation and delivery system in formation of pure chrome and other metals where a halide is the best precursor that is non-contaminating, consistent, useful in commercial scale operations, long lasting, and simple. The present invention solves and provides answers for all of the problems presently encountered with metal halide formation and delivery and has a considerable operation life with low drift.

Effusion cells, often used to supply metal atoms to a furnace or more often as a sputtering source, are single use devices where a crucible is heated and flow through an orifice provides the metal atoms needed for formation of a metal layer. An Effusion cell such as the Knudsen cell is a one use source, supplies metals, and may easily cause contamination. Effusion cells and more specifically the Knudsen Cells are small and totally unsuited to commercial scale thick deposition systems. There is a need for CVD directed, chemical compound sources for CVD systems, especially for large scale, heavy deposit commercial systems. The need is especially acute for metal halides that have high boiling points or sublimation points.

The present invention provides a source of metal halide as a gas and the source has a life of months between the refills. Long life and copious supply is important because the need is for large scale reactors and in such reactors, refilling can add contaminants and enable leakage. There is also a need for a source of metallic compounds, especially of a metal halide, that is controllable separate from the conditions of a CVD furnace, and that is reliable and simple to use in commercial size CVD systems.

BACKGROUND OF THE INVENTION

This invention provides a source of metal halide gases for large scale CVD reactor systems that enable the deposition of thick, low stress, coatings on metallic substrates that are of high purity, crack free, and adherent.

The invention provides a long lasting source of halides and, since it needs refilling at rare intervals, lessens the possibility of process variations or contamination.

The metal halide generation is controllable and self limiting and the deposition reaction within the CVD furnace has low drift and easy flow control.

The construction of the metal halide source vessel and outer housing insures maintainable high vacuum seals and has heaters protected from corrosive influences and contamination.

This invention further provides for the use of a variety of metal forms usable as source materials subject only to the requirement that gas flow can be maintained through the metallic source materials.

Metal halides, especially the chlorides, are critical components of successful chemical vapor deposition (CVD) of pure metal layers in a low pressure reactor/furnace due to their reactivity and the ease of deposits that are pure. The atom of the halogens is large, easily react in the deposition process and in many cases have no interaction in a CVD plasma assisted environment with the substrate being coated. The size of the molecule and mode halide dissociation in the reaction also contributes to the deposited metal being exceptionally halide free.

Supply of a metal halide gas to a pilot or research reactor is relatively easy due to the small scale encountered in such units. Knudsen cells with a metal compound containing crucible surrounded by a heater inserted into a port of the reactor vessel for example provide small quantities of metal halide or other gases that are ejected (effused) from the cell into the reactor. These cells are for one use and their changing can create contamination. Gaseous metal halides may be available in small quantities for direct injection into small reactors. For commercial size reactors gas supply and prevention of contamination are critical limiting factors. The present invention provides a long lasting, multiple use source for metal compound formation and gasification through self limiting reactions to provide contaminant free reactive metal halide vapor feed to large commercial CVD furnaces.

The use of chromium in chromizing extends back to at least the early fifties. The National Bureau of Standards had translated Russian books on the subject in the 60's where chrome was made available by the packing of parts in a chrome or chrome ferroalloy powder with enough fillers (clays) to prevent surface welding. The chrome packed parts were typically welded into a container which was then heated as hydrochloric acid fumes were introduced. The halide is constantly recycled in formation of metal halides and then deposition of the metal. The reaction is not selective and ferrocompounds form and thus purity cannot be achieved. A number of hours at over 1000 degrees C. forced the chrome as metal atoms into the surface of the parts with a net surface content of up to 85% chrome by weight and diffusion into the base metal. At the end of the heating, the container is cut apart and parts and filler are separated. This was the state of the art for a number of years until better technology was developed.

With the advent of sputtering, where ions were accelerated by electromagnetic force to impinge on a surface higher purity metal deposits (especially chrome) were possible. This method however was limited to line of sight deposition from the emitter part of the sputtering apparatus, and large parts were difficult due to the dispersal pattern of the metal molecules.

CVD, the chemical vapor deposition in the late 80's provided another method for the deposition of metals, this time free of the line of sight restriction. As the technology advanced the possible products went from complex thin layer metal coatings such as used on microchips. The use of titanium and other low boiling point metal halides increased and TiN and TiCN became popular. The plasma enhanced CVD (PECVD) furthered the progression of the strong electrical attraction to a target part plus chemical attraction now possible. The stage was set for development of thicker pure metal deposits on parts and this was possible with the low reactivity easily vaporized compounds of metals the highly reactive and high temperature reactive metals such as chromium were not as easily handled and the limitations of precursor metal halide supply prevented the commercial deposition of thick metal layers of many desired metals.

Metal halides are an excellent source of reactant for CVD processes due to lack of secondary reactions with the halogen and the reactivity caused by temperature and pressure dependent decomposition of the metal halide molecule. A key problem is that metal halides are a nightmare to handle. While there are metal chlorides that are liquid at room temperatures (TiCl4 for example), stable or relatively stable at these temperatures despite being highly corrosive, other halides are highly corrosive and exist as a liquid or gas only at high temperatures. Minor contaminants may also cause deposition of products or much accelerated corrosion. The first group (room temp liquids and moderately reactive) are used in many common processes such as formation of titanium nitrides or other titanium compounds. The second group has allowed experimental development work by use of small halide injectors or vaporization cells of various types. The problem is the scale up of these lab sized injectors into a commercial scale where the corrosion and related contamination problems have stymied process development. The result has been the use of other compounds such as organic chrome compounds or different and less useful processes such as sputtering instead of the more difficult ways of generating and using metal halides with CVD or PACVD processes (PACVD and PECVD are interchangeable in the context of this disclosure).

To form a gas of a metal halide, high temperatures are required for a major portion of the possible metal halide formation processes and the high temperature halide portion can react with and remove metal ions or atoms from such normally non-reactive materials as Hastelloy alloys, pure nickel, and many other normally non-reactive substances and metals. Even if the goal of the CVD deposition is a metal alloy, reactions that occur uncontrolled in the metal halide delivery system can cause an imbalanced alloy or cause improper alloys to form. When, in the more usual case pure metals are desired, contamination creates fatal flaws.

One good example of the corrosion problem was a hastelloy tube where the hot chromium chloride gas corroded both ends, but had relatively little effect on the center portion. Such temperature biased corrosion means that as conditions change even slightly, the zone of corrosion and the extent and content of corrosion products would change resulting in a process totally out of control. A totally non-reactive container is needed for the reactor that remains non-reactive from the first heating of halogen containing incoming gases to the actual delivery into a reactor and the reaction zone therein.

The non-reactive container must still be heated, must be supported within a vacuum capable chamber or feed element, and be removable as needed without damage to the vacuum containing capability of the production system. There is a lack of devices acting continuously that provide all of these needed elements.

DESCRIPTION OF THE INVENTION

A non-reactive container is supplied with one or more non-reactive grids upon which a gas permeable fill of metal is provided, the metal affording a high surface area to gas flowed through the fill. A halogen containing reactant gas flow inlet and a reacted compound outflow is provided. The non-reactive container is sealed at the fill point and at the inlet and outflow so the reactant gas and the reacted compound are contained within the non-reactive container. The non-reactive container is supported centrally within a long corrosion resistant pipe section which is the outer housing of the invention and which has external heaters in the region of the non-reactive container and extending beyond the non-reactive container location by an amount that insures the heaters can supply uniform temperature within the container. The length of the long corrosion resistant outer housing is determined by a need to cool the outer housing such that the high vacuum seals of the outer housing and the inlet and outflow can be maintained for extended periods of time. Between the non-reactive container location and the CVD furnace there is a weldment that insures that any leakage of inflowing gas is contained within the outer housing section containing the non-reactive vessel. The non-reactive container is in fluid communication with an external source of halogen or hydrogen halide reactant that flows through the inlet, through the grid and around the particles of the fill of metal wherein it reacts and that reacted product which is the metal halide precursor fluid then exits in fluid communication with and through an outflow tube into and in fluid communication with a CVD furnace.

In this invention the flows of gas may be of various configurations, from top to bottom or so the gas bubbles up from the bottom to the top. The inlet and outflow locations consisting of non-reactive tube or tubes determine the flow direction and the internal mode of operation. The reactant gases introduced by the inlet may be halogen containing gases, in particular hydrogen halides.

The invention also may have a number of non-reactive grids to allow for serial filled areas within the non-reactive container, thus providing a protection against tunneling or partial bypass of the metal fill by reactant gas. Each grid consists of a porous plate or grid which supports the metal fill and is in turn supported internally by non-reactive supports.

In operation, the non-reactive container is brought to a reaction temperature by the heaters mounted on the external housing. A halogen gas ($X_2$) or a hydrogen halide such as HX reactant is then introduced into the non-reactive container by means of the inlet tube, the reactant traveling through the inlet and the supporting grid into the zone of metal fill where it reacts with the metal fill to form a metal halide. The external heaters keep the container and its contents at a temperature that insures reaction and that is above the metal halide's boiling or sublimation temperature and then this gaseous reacted metal halide continues to flow through the outflow tube into a CVD furnace.

The control of this metal halide reactor is maintained only through the temperature of the fill of reacting metal which is a function of the external heater temperature and the flow of gas through the inlet tube, and the heat of reaction. The reaction within the non-reactive container is heavily weighted to provide excess metal beyond the stoichiometric ratio and excess metal surface for the creation of the metal halide so that the reaction will completely converts all of the reactant to metal halides thus reactant gas flow is the single greatest (and easiest) mode of flow control of the metal halide. Since the reaction product, the metal halide, is at a temperature above its boiling point or sublimation point, no reacted product builds up within the non-reactive container or its fill of metal.

Since the non-reactive vessel is in fluid communication with the CVD furnace, the pressure within the non-reactive vessel is set by the (CVD type) furnace and is not separately controllable. One further unique property that this precursor supply method for metal halides provides is the possibility to control the type of deposition via temperature. It is hypothesized that the reaction state (i.e. the type of halide due to the valence of the metal in the metal halide formed) of the halide may have effect upon the quality and properties of the resultant deposit. As an example, a $CrCl2$ metal halide gas precursor to deposition may react in stress levels or in deposit surface characteristics differently than that of deposit from a $CrCl3$ metal halide gas or a mixed $CrCl2/CrCl3$ gas precursor to deposition. It is noted that the temperature of the reactor converting metal to metal halides in this invention can be controlled either through the heaters in the external housing or through selective placement of the metal halide creating vessel within a CVD type furnace, especially within a plasma assisted (or enhanced) or a pulsed plasma enhanced CVD furnace. With the closed vessel converting metal with halogen or halogen compounds to metal halides, location remote from the plasma and deposition target would allow lower temperature of formation for the metal halides which can drive the reaction of the halogen and the metal towards the creation of larger amounts of $CrCl3$ compared to the amounts of $CrCl2$. Alternately, the external reactor with its housing heated can produce metal halides while controlling the reaction temperature of the metal halide formation at either a lower or higher temperature than the target within the CVD furnace and thus control which species of the metal halide predominately decomposes there backward into the metal and halogen containing gas or even control for a specific mix of metal halide species.

Looking at the chart in FIG. 5, note that, at a pressure of 0.1 mbar and a temperature of 800 degrees C., the calculated equilibrium composition reached, starting from a mixture between solid chromium gaseous hydrogen (H2) and hydrogen chloride (HCl) after establishing its thermodynamic equilibrium would contain nearly equal molar amounts of $CrCl2$ and of $CrCl3$. At 1000 degrees C., the ratio has shifted and now the $CrCl2$ is over 4 times as much as the $CrCl3$. Assuming relatively fast establishment of equilibrium, this would allow the shifting between the types of the halide molecules before deposition within a CVD furnace. The closed vessels wherein metals are converted to metal halides are, at the given pressure set by the CVD furnace, still temperature controllable in this invention thus providing a unique control over the species (the type and valence) before starting the reactions within a CVD furnace.

Further looking at driving forces within the thermodynamics of chromium chlorides, the transported species, Cr, from the gaseous form of $CrCl2$ at 900 degrees C. is driven towards deposition on an 800 degree substrate in the reaction $Cr+2HCl<->CrCl2+H2$ while the reverse is true of the reaction of $Cr+Cl2<->CrCl2$. Similar driving forces both towards a cooler (800 degree C.) substrate and a hotter reactor (900 degrees C.) and the reverse of a cooler reactor (800 degrees C.) and a hotter substrate (900 degrees C.) exist for other reaction combinations within the HCl and the Cl2 reactions of chromium. The metal halide formation mode is made controllable within the bounds of the reaction of metals in various metal to halogen ratios by variations in the temperature of the non-reactive vessel housing the reactants. As an example, the chromium used as the primary example herein using the non-reactive vessel creating metal halide precursors of various species (i.e. various valences which give various chlorine to chrome ratios) by variation in temperature, thus possibly providing a partial control over the type of metal ion (the valence) in the halide involved in deposition within a CVD type furnace.

Some startling results have been determined once a reliable supply of reacted metal halide vapor became available in large (meter and above) CVD and PECVD furnaces. The distribution of the vapor in the low pressure environment of the CVD or PECVD furnace was not critical. While a number of chip making CVD furnaces employ showerhead distributors, the vapor distribution into the plasma region was sufficiently uniform that no directionality of deposition was evidenced. This allows an important simplification of the vapor flow path within the CVD furnace.

The resultant layers of metal from the CVD reactor are further exceptionally stress and crack free as compared to plated coatings as discussed below.

The precursor forming reactor, according to this invention, has use with specific compounds. In general, metals that have a boiling point above 350 degrees C. or that directly sublimate at high (above 500 degrees C.) are most useful in this invention. While chromium is the main focus of this invention, a number of metals that have compounds with high melting points and boiling (or sublimation) points at normal pressure are workable within the boundaries of this invention. Chromium where the $CrCl2$ has an 820 degree C. melting point and a 1302 degree C. boiling point at standard pressure is a typical ideal use of this invention. The relative unavailability of the halide compound and the corrosivity of the compound further recommend the use of a high temperature reactor to create the needed metal halide for chromium CVD or PECVD deposition. The lowering of pressure within a reactor vessel allows a relatively constant flow of input gaseous chlorine or hydrochloric acid gas to react with a sand like fill within a reactor zone defined by a base fill support and a top of the fill. This zone, at a temperature that causes reaction converts the chlorine or hydrogen chloride incoming gas to a metal chloride which, being above its boiling point and/or its sublimation temperature at the pressure of reaction is flowed as vapor into a CVD type furnace chamber, also at a reduced pressure.

The metals of interest are evident to anyone with access to the melting points (mp) and boiling points (bp) of the metallic compounds. While the mp and bp numbers cited herein are those at standard pressures, the reduction in pressure does not cause drastic variations in the relative mp values to the extent that the metal compounds become easy to handle or produce. Even at very low pressures, these metal halides are hard to handle.

There are basically two groups of metal halides that benefit from the use of this invention. The first group consists of the metal halides that have relatively high boiling points or have only sublimation temperatures while the second group has lower boiling points, it remains very difficult to handle these metal halides and the deposition process would benefit from control of the species of the halide (the valence).

Chromium chlorides are an example of the first group. Other metal halides of interest within this first group are chlorides of beryllium with a 405 C mp and 488 C bp, uranium with a 589 melting point and a 792 degree C. boiling point, aluminum with a melting point of 1290 for the fluoride form, gallium fluoride with a 950 degree C. sublimation point, and bismuth with a 447 C boiling point for the chloride form (all at normal pressure). While this list is suggestive and not comprehensive, it points to the wide range of materials that can be included within group 1 of the reactant metal halides. It may also be noted that there are metals that fit into the first group with one of the halides such as AlF3 and into the second group with AlCl2 or AlBr3 and AlI3

The second group of interest has moderate boiling points, in the under 350 degree C. or below range which makes these metal halides easier to handle but where the invention still has considerable value in that the problem of condensation within valves, the possibility of contamination and the mass flow needed for commercial applications still require the use of an in reactor precursor source for CVD operations or use of a CVD furnace coupled precursor formation device. The second group contains the metals molybdenum (194C mp/286 C bp for the Mo(V) chloride), vanadium (154 degrees C. bp/247 degrees C. bp for the V(IV) chloride), niobium (247 bp for the Nb(V) chloride), tantalum (233 degrees C. bp for the Ta(V) chloride form), aluminum chloride (193 degrees mp), gallium chloride (201 degrees C. bp) and arsenic(III) (130 degrees C. bp—all at normal pressure). Again, as noted above the list is not comprehensive but merely indicative showing the number of difficult metal halides that benefit from this sealed non-reactive vessel based metal halide formation scheme.

Particularly of interest, in addition to chromium and aluminum are the very toxic beryllium with a 405 C mp and a 488 C bp, manganese (650 C mp/1190 bp), and zirconium (437 C bp/730 C bp for the Zn(IV) chloride).

While the chlorides of metals have been discussed above, any practitioner of the art will recognize that the fluorides, iodides, and bromides of metals are also applicable to this invention and they are included within the word halogen or the compound hydrogen halide and halogen containing gas. The use of these other halides, as gases or as reacted compounds such as hydrogen halide vapors, in similar containment vessels made of non-reactive materials using this method will also produce useful metal halide gases for commercial CVD and PECVD furnaces.

Use of metal carbonyls, oxylates and other possible precursor compounds are not effective in this invention since the goal is production of a precursor that enables high purity metallic deposits. The ineffectiveness relates to the difficulty in rapid formation of these compounds from the metal form and to the probability of chemical interactions such as formation of oxides or carbides on the surface of within the coating material, thus defeating the purity of the deposits. Despite their difficulty in formation and handling, the metal halides are an ideal precursor.

PREFERRED EMBODIMENT OF INVENTION

Figure 1:
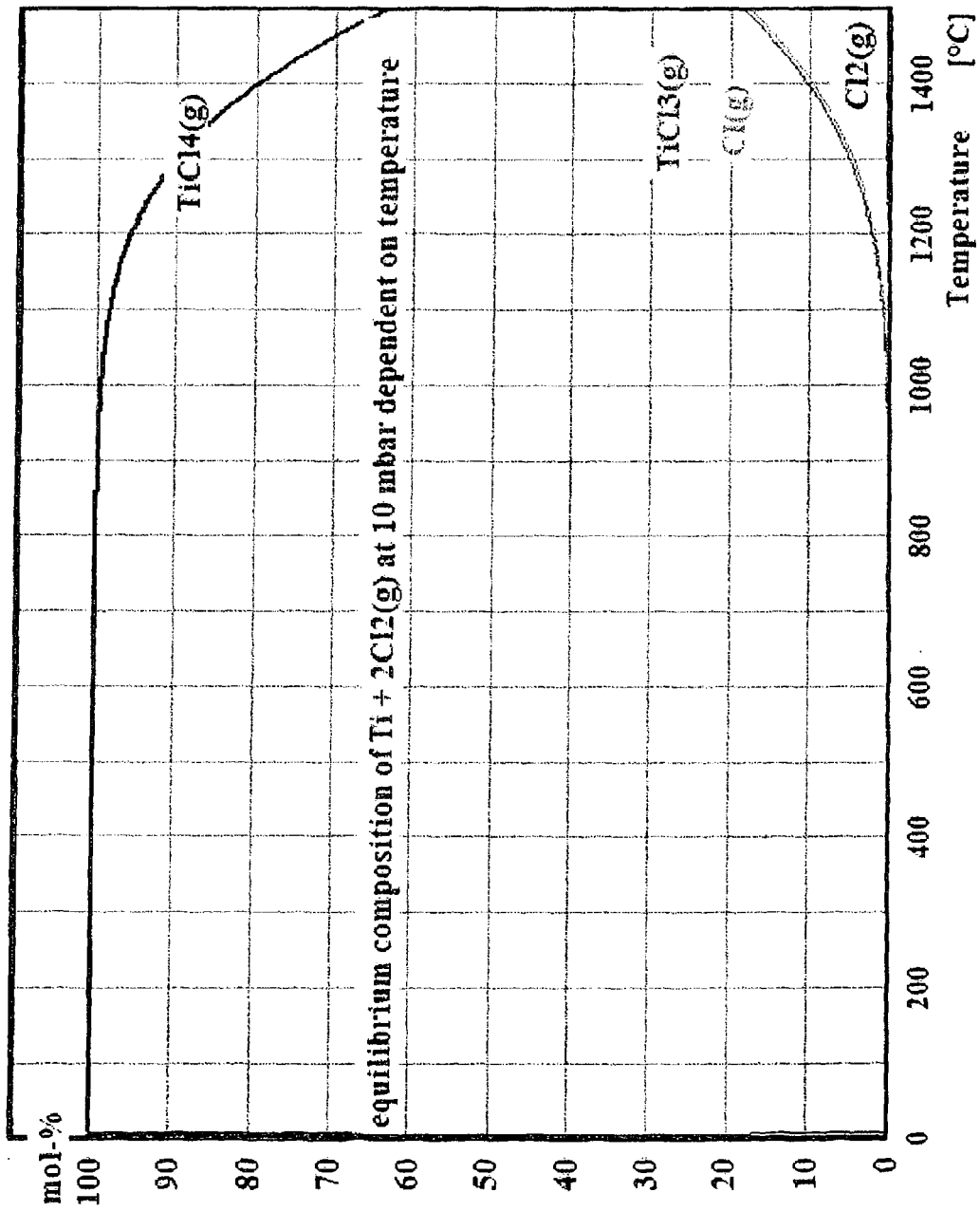
In FIG. 1 the non-reactive vessel is shown with a fill of chromium pellets and a sealed top and seals at the interface between the inlet tube and the outflow tube.

In the most preferred embodiment of this invention is shown in FIG. 1 where a metal halide source is coupled to a CVD furnace where container is formed from a cylinder of refractory materials such as alumina (shown as 1) in this case and a bottom or base 4 with a hole sized for an inlet tube 2 is fashioned and sealed with refractory cement 3 to this base 4 of the cylinder of alumina.

Within the alumina cylinder is placed a second alumina cylinder 5 of slightly smaller diameter than the inside diameter of the alumina cylinder and a height of less than 2 cm and upon this second inner cylinder is placed a perforated plate of ceramic materials 6.

A removable plate of alumina 7 designed to fit within a groove 8 in the open end of the alumina cylinder is then fitted to the cylinder end, this plate having an offset or slots 9 which provide an outlet in fluid communication with the interior of the vessel.

The inlet tube is cemented with refractory cement to the base plate 4 end piece to form a vapor proof seal.

The inside of the alumina cylinder is filled with chromium pellets 11 sized as to not fall through or plug the holes on the ceramic perforated plate. The fill is at least 5 cm thick to provide large surface areas for reaction. The pellets may optionally be enclosed by porous or perforated filter top 10.

The top 7 is placed upon the cylinder and it is sealed with a vapor proof seal except where there are exit slots 10 which is a removable form of refractory cement.

Figure 2:
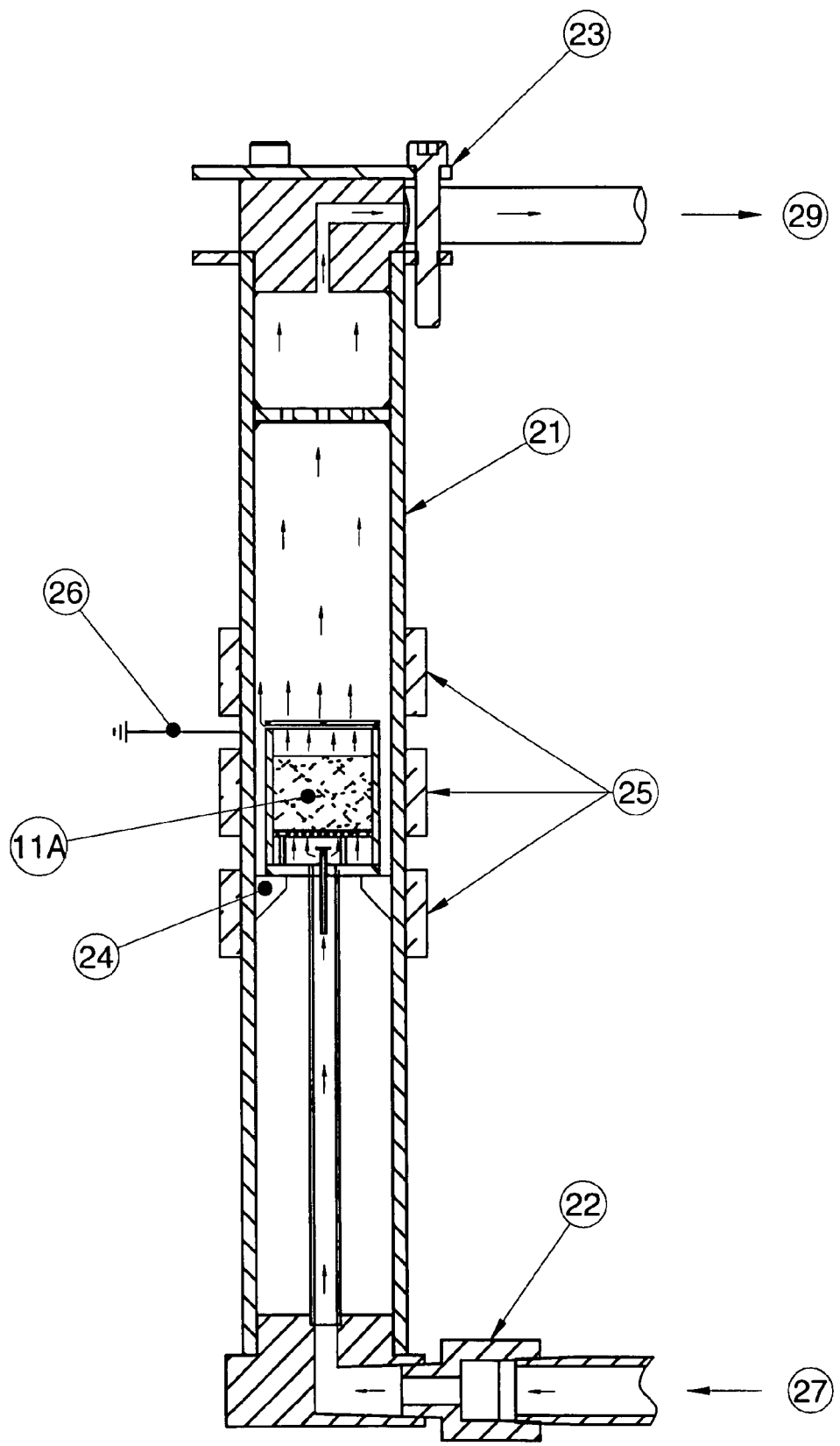
In FIG. 2 the non-reactive vessel is shown located upon standoffs within a stainless tube which has external heaters and top and bottom seals or access to a CVD furnace vessel. The tube has considerable length with no heaters to allow for ambient cooling of the tube.

As a further example of this disclosure, shown in FIG. 2, an external outer housing for the invention is constructed from a pipe segment 21 that is at least 6 times the height of the cylinder. This pipe segment has a diameter that is sized to accommodate the ceramic/alumina filled cylinder as shown in FIG. 1 plus at least two centimeters of inside diameter and is placed centrally within a tube of a length sufficient to provide some cooling, typically a length of at least 6 times the height of the filled cylinder. The pipe segment has vacuum seals at both ends 22, 23 as are well known in the industry.

This non-reactive ceramic/alumina cylinder, now converted to a filled container with metal fill is then placed upon standoffs mounted within the portion of pipe 24 so the cylinder is at the middle of the length of the pipe and centrally located within the pipe such that the axes of the pipe and the cylinder coincide. The pipe 21, longer than the height of the filled container, is the outer housing of this invention.

To the outer housing are bolted external heaters 25, extending beyond the height of the non-reactive cylinder which is located near the mid point location of the non-reactive cylinder length within the outer housing (i.e. the heaters extend along the cylinder at least the height of the cylinder plus beyond the cylinder height). The heaters are of high temperature construction well known to practitioners within the field. The heaters are controlled by a controller via the signal from a thermocouple in contact with the outer housing 26 within the heated area. Halogen containing gas is introduced at the bottom 27 and after reacting with the fill in the non-reactive cylinder 28 flows out of the reactor and into a CVD type furnace from 29.

Figure 3:
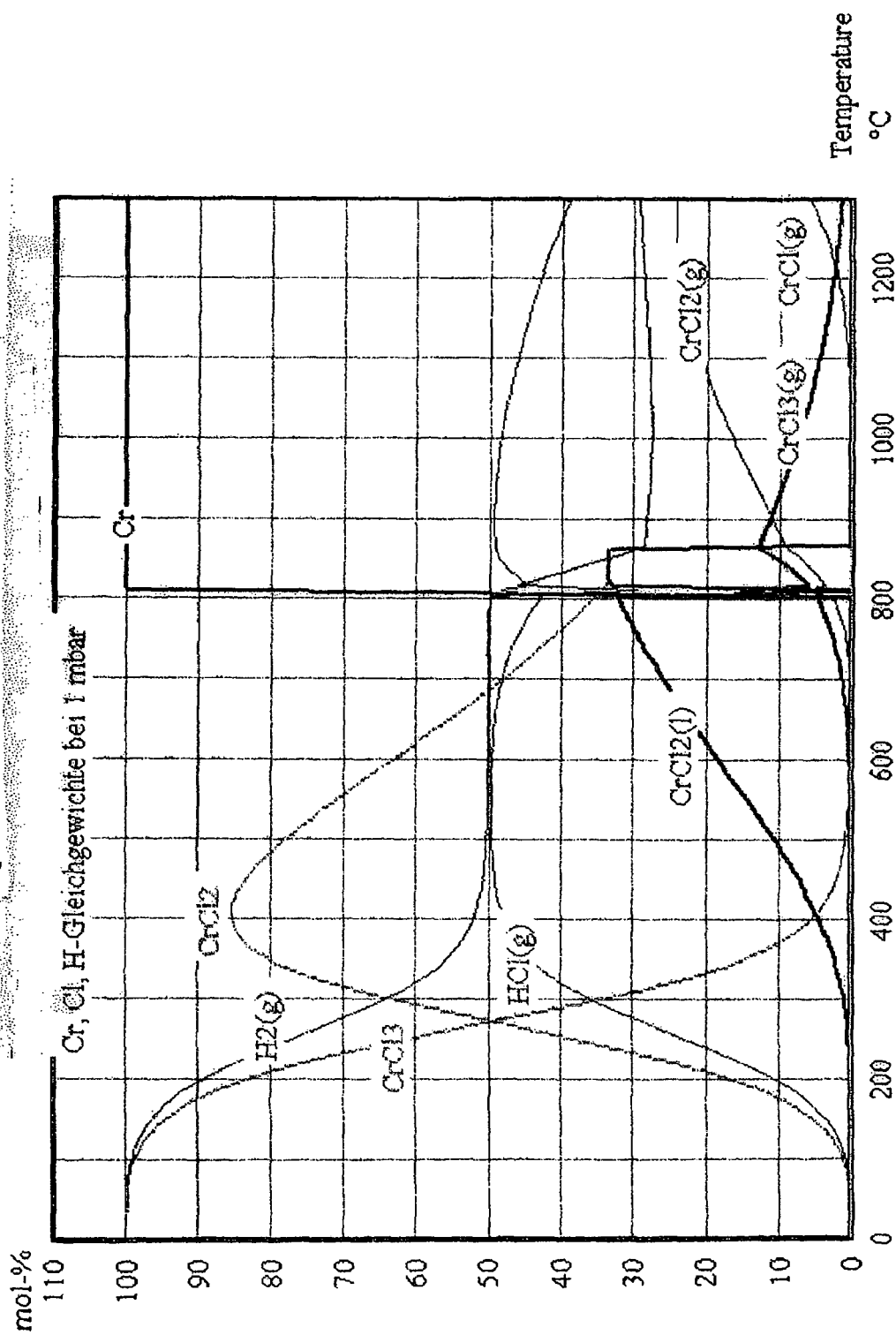
In FIG. 3 the non-reactive vessel of FIG. 1 is shown with the gas flow reversed.

In operation, the non-reactive container 1A, shown in cross section in FIG. 3 with top 7A, base 4A and fill 11B that rests on the perforated plate 6A, which is usually maintained with a low N2 flow is switched to a hydrogen purge. This purge, like the N2 enters through tube 2A. As the hydrogen purge is continuing, pressure is reduced to a milibar level. The reduced pressure internal to the housing insures little convection action. The heaters heat the vessel to over 1000 degrees C. then dry hydrogen chloride gas 31 is introduced through a flow control into the vessel via the inlet tube 2A. At the temperatures above 1000 degrees C. the hydrogen chloride gas with possible other gases as co-reactants and carrier gas flows through the vessel, in contact with a large surface area of chromium fill 11B caused by the relatively fine particle size. As the reactive HCl gas 31 flows through the bed of chromium 11B, which is supported within the vessel by a non-reactive grid 6A, it reacts and forms chrome chlorides (CrCl2, CrCl3 and eventually CrCl4 depending upon the temperature of the non-reactive vessel). The chrome chlorides and the carrier gas is swept through the remaining bed of chrome metal where it reacts to chromium chlorides and out of the vessel via the outflow slots 9A into the CVD furnace 33.

At the end of the CVD cycle the flow of chrome chlorides are stopped by shutting off the flow of hydrogen chloride and continuing the hydrogen purge while the external heaters are turned off so the temperature gradually is reduced to ambient. The vessel may be stored under dry nitrogen purge for an indefinite period of time between uses.

The reactor, since it holds a considerable amount of chromium, does not have to be refilled except after extended uses. The positioning of the vessel, ideally in a gas input duct leading to the CVD furnace with space around the vessel such that gas flow is not obstructed, allows the vessel to be used as needed and stored full and purged until it is again needed.

In another preferred embodiment the non-reactive filled vessel of the most preferred embodiment is placed into a CVD furnace and the halogen containing gas, introduced through a vacuum sealed tube that allows a flow of halogen containing gas from a source such as a supply cylinder with pressure reducing flow meter and this gas is allowed to flow into the non-reactive vessel through the supporting grid plate and the permeable metal fill contained within the non-reactive vessel and out an outflow tube or orifice into the CVD furnace.

Figure 4:
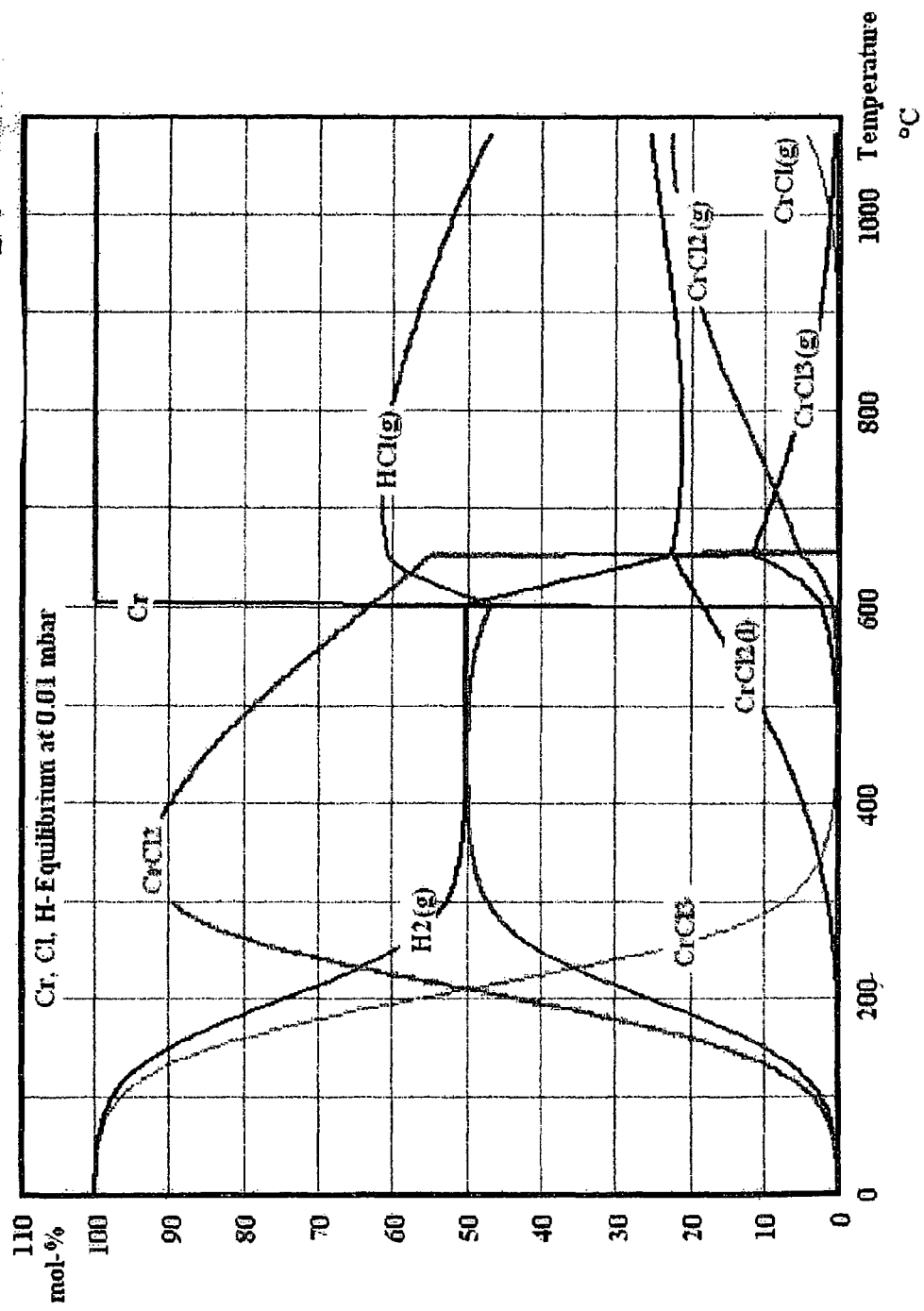
In FIG. 4 the non-reactive vessel in FIG. 1 is shown with multiple grids and fill zones to minimize tunneling within the fill.
Figure 5:
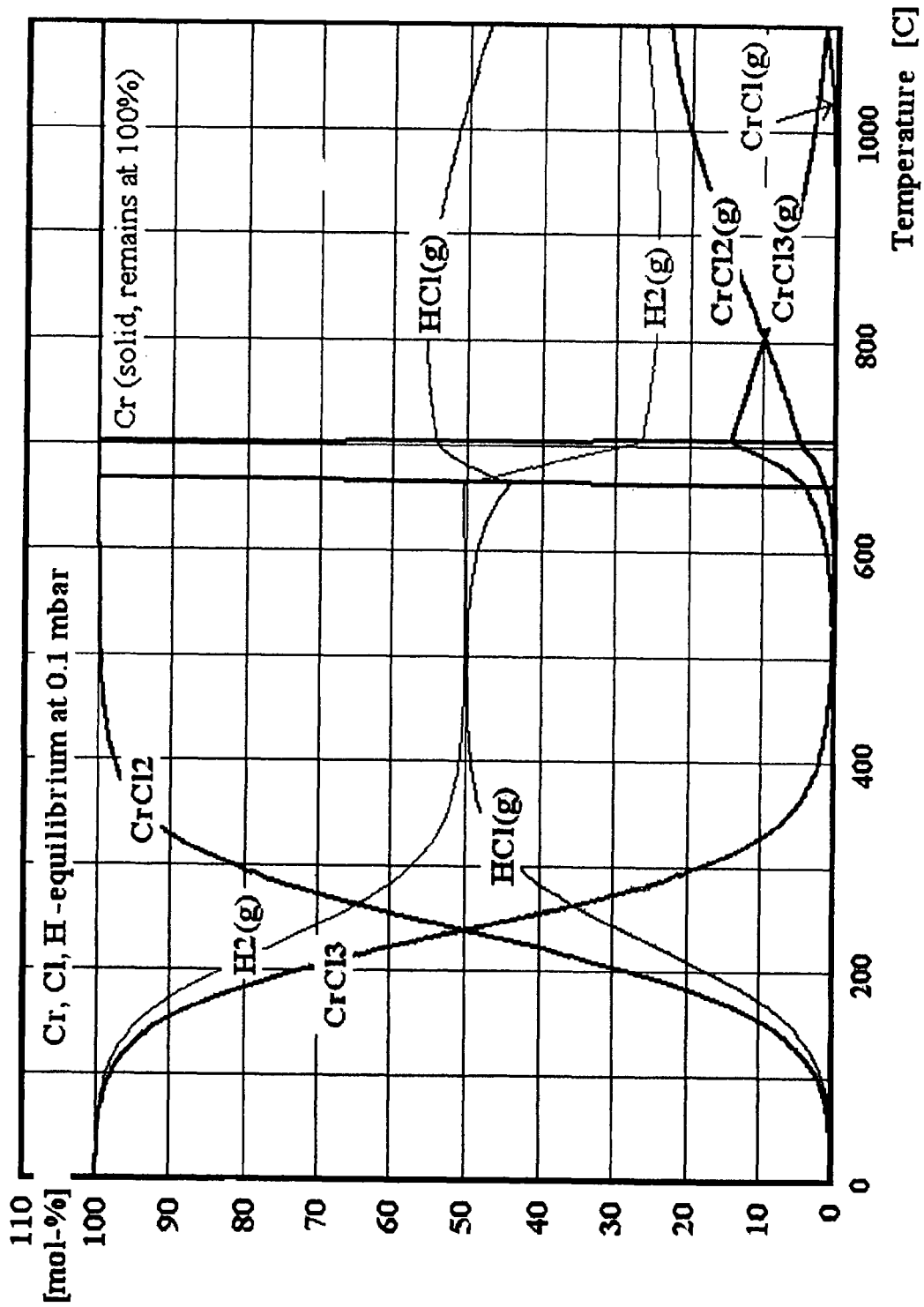
FIG. 5 shows a diagram of the calculated thermodynamic equilibrium composition dependent on temperature for a fixed pressure of 0.1 mbar. The relative amount of the different gaseous chromium chloride gases, especially of CrCl2 and CrCl3 is seen at a variety of temperatures.

In another embodiment, the device in the third embodiment shown by FIG. 3 is further modified in FIG. 4 such that the inflow from the supply cylinder also has an added hydrogen flow 41 that is used to cool and maintain the fill in dry, reaction free state when the CVD furnace is heating or cooling or is otherwise inoperable. The inlet 2B delivers halogen gases 43 to the base of the perforated plate 44. The halogen gases go through a first layer of chromium pellets 11C and traverse upward then the partly reacted and non-reacted gases pass through a second perforated plate and into a second fill area of chromium pellets 11D prior to exit from the reaction vessel through slots 9B. This prevents channeling and insures that reactants are totally used prior to the exit slots 9B.

In a fourth embodiment a hydrogen halide gas is used as the reactant introduced into the vessel by the inlet tube.

In a fifth embodiment a halogen containing gas is used as the reactant introduced into the reactor by an inlet tube.

It is noted that the gases within the group 7 of the periodic table (any halogen) are all useful in this invention The halogen, hydrogen halide, and mixed hydrogen halides or halogens and the metals that they react with are all apparent to the skilled practitioner within this field. It is further evident that, given the concept herein the shape, specific location and the temperatures of this invention may be changed within a considerable range within these teachings.

It is further noted that any metal fill selected from a group containing the elements Cr, W, Mo, V, Zn, Mn, U, Nb. Ta, Al, Ga, Sn, Si, As, Bi, Be, and Zr are useful in this invention and that a wide variety of metal fill materials may substitute for the chromium noted as examples above. The halogen, hydrogen halide, and other halogen containing compounds as well as the metals that they react with are all apparent to the skilled practitioner within this field. It is further evident that, given the concept herein the shape, specific location and the temperatures of this invention may be changed within a considerable range within these teachings.

One skilled in the art will readily appreciate that the present invention is well adapted to carry out the objects and obtain the ends and advantages mentioned as well as those inherent therein or specifically mentioned. It will be apparent to those in the art that various modifications and variations can be made in practicing the present invention without departing from the spirit or scope of the invention. Changes therein and other uses will occur to those skilled in the art which are encompassed within the spirit of the invention as defined by the scope of the invention

I claim:

1. A high temperature metal halide producing reactor producing substantially pure metal halides in a controlled manner for commercial scale reactors, comprising:

an external housing constructed from a pipe segment consisting of external walls, two ends, and vacuum seals in at least one end, allowing inert atmosphere and/or vacuum conditions within said external housing;

a non-reactive sealed container formed from a cylinder with a top and a bottom supported by supporting means inside said external housing;

said pipe segment being at least 6 times the length of the cylinder, and said pipe segment having a diameter that is sized to accommodate the cylinder plus at least 2 centimeters of inside diameter;

said non-reactive sealed container being supplied with at least one inlet port and at least one exit port, both of non-reactive construction, said inlet port having fluid communication with a fluid source external to said external housing and said exit port having fluid communication with a furnace outside said external housing;

at least one internal supporting media held by holding means within said container;

a fill of a metal or a metallic compound within said sealed non-reactive container upon said supporting media in a form allowing flow of gas through said fill; and heating means surrounding said external housing and extending beyond top and bottom positions of said non-reactive sealed container within said external housing, said external housing having sufficient length beyond the length of said heating means to allow cooling of said walls of said external housing such that vacuum seals may be maintained at either end of said external housing;

wherein said non-reactive sealed container is heated to specific temperatures and a gaseous halogen or halogen containing compound is introduced into said non-reactive sealed container by said inlet port, allowed to flow through said fill of the metal or metallic compound, reacting therewith, to form said metal halide and said metal halide then exits through said exit port into a CVD, PECVD, PPECVD or other said furnace separate from said halide producing reactor and with a separate heating means with means for deposition of said metal component of said metal halide at temperatures different than those of said halide producing reactor.

2. The reactor of claim 1, wherein said metal of said fill is selected from the group consisting of the elements Cr, W, Mo, V, Zn, Mn, U, Nb, Ta, Ga, Sn, Si, As, Bi, Be, and Zr.

3. The reactor of claim 1, wherein multiples of said supporting media are employed, each with a separate amount of fill upon said supporting media and each supporting media held within said non-reactive sealed container by holding means.

4. The reactor of claim 1, wherein said fill is granulated metal, metal turnings, metal sponge, metal powder, metal pellets, or other large surface area metal particles.

5. The reactor of claim 1, wherein said gaseous halogen or halogen containing compound is iodine, chlorine, bromine or the hydrogen compounds of these halogens or other halogen containing compounds including compounds between different halogens.

6. The reactor of claim 1, wherein a flow control means located in fluid communication with said inlet port controls the flow of said gaseous halogen or halogen containing compound.

7. The reactor of claim 6, wherein a purge gas is also introduced into said inlet port.

8. The reactor of claim 1, wherein said inlet port is also in fluid communication with a source of measured flow of a purge gas which is used both when said reactor is operating and when said reactor is not being supplied with said gaseous halogen or halogen containing compound.

9. The reactor of claim 1, wherein a purge gas source is supplied by purge gas supply means to said reactor when said gaseous halogen or halogen containing compound flow is halted.

10. A reactor for production of commercial quantities of metal halide vapor comprising a non-reactive closed container formed from a cylinder and surrounded by an outer housing constructed from a pipe segment that is at least 6 times the length of the cylinder; wherein the pipe segment has a diameter that is sized to accommodate the cylinder plus at least 2 centimeters of inside diameter; said container being essentially leak free, and said container comprising an internal supporting means upon which is placed a metal fill; wherein an inlet port, in fluid communication with an external source of a halogen gas or a halogen containing gas, provides a gas flow to said closed container; wherein said gas flows through said metal fill, reacting therewith to produce a metal halide vapor, and said metal halide vapor then exits from said closed container by an exit passage within the reactor which is in fluid communication with said closed container; wherein said closed container is in fluid communication with a deposition furnace; and wherein said reactor for production of commercial quantities of metal halide vapor and the deposition furnace are each controllable to separate temperatures.

11. A method of formation and supply of high purity highly reactive metal halide gases to a commercial scale CVD or PECVD furnace comprising providing the reactor of claim 10, flowing a halogen gas or a halogen containing gas through the inlet port of the closed container to react with the metal fill therein and to produce a metal halide vapor; discharging the metal halide vapor from the closed container via the exit passage; flowing the metal halide vapor into the CVD or PECVD furnace; and depositing the metal portion of the metal halide gas upon a substrate.

* * * * *